(12) United States Patent
Fuchey et al.

(10) Patent No.: US 12,361,610 B2
(45) Date of Patent: Jul. 15, 2025

(54) PREDICTIVE GEOLOGICAL DRAWING SYSTEM AND METHOD

(71) Applicant: Schlumberger Technology Corporation, Sugar Land, TX (US)

(72) Inventors: Yannick Fuchey, Montpellier (FR); Eric Moscardi, Cazilhac (FR)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 163 days.

(21) Appl. No.: 18/258,138

(22) PCT Filed: Dec. 17, 2021

(86) PCT No.: PCT/US2021/072980
§ 371 (c)(1),
(2) Date: Jun. 16, 2023

(87) PCT Pub. No.: WO2022/133482
PCT Pub. Date: Jun. 23, 2022

(65) Prior Publication Data
US 2024/0037819 A1     Feb. 1, 2024

Related U.S. Application Data

(60) Provisional application No. 63/199,273, filed on Dec. 17, 2020.

(51) Int. Cl.
*G06T 11/20* (2006.01)
*G06F 30/27* (2020.01)
(Continued)

(52) U.S. Cl.
CPC .............. *G06T 11/20* (2013.01); *G06F 30/27* (2020.01); *G06N 20/00* (2019.01); *G06T 11/001* (2013.01); *G06V 30/422* (2022.01)

(58) Field of Classification Search
CPC ........ G06T 11/20; G06T 11/001; G06F 30/27; G06V 30/422; G01V 20/00; G06N 20/00
See application file for complete search history.

(56) References Cited

U.S. PATENT DOCUMENTS

2005/0063592 A1   3/2005   Li
2014/0078140 A1   3/2014   Maucec
(Continued)

FOREIGN PATENT DOCUMENTS

KR   1020200002332 A   1/2020

OTHER PUBLICATIONS

Amorim R, Brazil EV, Patel D, Sousa MC. "Sketch modeling of seismic horizons from uncertainty." In Proceedings of the International Symposium on Sketch-based interfaces and modeling, Jun. 4, 2012 (pp. 1-10). (Year: 2012).*

(Continued)

*Primary Examiner* — King Y Poon
*Assistant Examiner* — Vincent Peren
(74) *Attorney, Agent, or Firm* — Jeffrey D. Frantz

(57) ABSTRACT

A method for representing a geology includes receiving one or more drawing strokes as part of a geological feature sketch, predicting, using a machine learning model, one or more predicted geological features based at least in part on the one or more drawing strokes before the sketch is complete, displaying the one or more predicted geological features, receiving a selection of one of the one or more predicted geological features, and generating an image representing the geology including a digital representation of the selected one of the one or more predicted geological features.

17 Claims, 12 Drawing Sheets

(51) Int. Cl.
  *G06N 20/00* (2019.01)
  *G06T 11/00* (2006.01)
  *G06V 30/422* (2022.01)

(56) References Cited

U.S. PATENT DOCUMENTS

2018/0349415 A1* 12/2018 Abreu de Paula .. G06F 16/5838
2019/0266769 A1   8/2019 Yeon
2021/0304482 A1   9/2021 Park

OTHER PUBLICATIONS

Amorim R, Brazil EV, Samavati F, Sousa MC. "3D geological modeling using sketches and annotations from geologic maps." In Proceedings of the 4th joint symposium on computational aesthetics, non-photorealistic animation and rendering, and sketch-based interfaces and modeling; Aug. 8, 2014 (pp. 17-25). (Year: 2014).*
Jackson MD et al. "Rapid reservoir modeling: prototyping of reservoir models, well trajectories and development options using an intuitive, sketch-based interface." InSPE Reservoir Simulation Conference Feb. 2, 20153 (p. D031S010R002). SPE. (Year: 2015).*
Ferreira RS, Noce J, Oliveira DA, Brazil EV. "Generating sketch-based synthetic seismic images with generative adversarial networks." IEEE Geoscience and Remote Sensing Letters. Oct. 15, 2019; 17(8):1460-1464. (Year: 2019).*
Liu R, Shen L, Chen X, Ji G, Zhao B, Tan C, Su M. "Sketch-Based Slice Interpretative Visualization for Stratigraphic Data." Journal of Imaging Science & Technology. Nov. 1, 2019; 63(6). (Year: 2019).*
Extended Search Report of European Patent Application No. 21908050.4 dated Oct. 14, 2024; 11 pages.
Search Report and Written Opinion of International Patent Application No. PCT/US2021/072980 dated on Apr. 14, 2022, 09 pages.
"Quick, Draw" In Experiments with Google, By Google Creative Lab, Retrieved from https://experiments.withgoogle.com/quick-draw, May 2017, 02 pages.
"Auto Draw", Retrieved from https://experiments.withgoogle.com/autodraw, Experiments with Google, By Google Creative Lab, May 2017, 02 pages.
Baraboshkin, E. E., et al., "Deep Convolutions for In-Depth Automated Rock Typing", Arxiv.org, Cornell University Library, 2010 Lin Library Cornell University Ithaca, NY 14853, Sep. 23, 2019 (Sep. 23, 2019), XP081480425.
Eitz, et al., "How Do Humans Sketch Objects", In Journal of ACM Transactions on Graphics, Retrieved from http://cybertron.cg.tuberlin.de/eitz/projects/classifysketch/, vol. 31, No. 4, 2012, 02 pages.
Louis, Pauline C et al., Creation of a digital geological field data collection tool to improve data retention and valuation, , Sep. 30, 2020, pp. 1-80, XP093211072, DOI: 10.13140/RG.2.2.28250.77762, Retrieved from the Internet: https://www.researchgate.net/publication/347422911_Creation_of_a_digital_geological_field_data_collection_tool_to_improve_data_retention_and_valuation, [retrieved on Oct. 2, 2024-].
Mould David et al., "3D geological modeling using sketches and annotations from geologic maps", Proceedings of the 4th Joint Symposium on Computational Aesthetics, Nonphotorealistic Animation and Rendering, and Sketchbased Interfaces and Modelling, Aug. 8, 2014, pp. 17-25.
Natali Mattia et al., "Sketch-based modelling and visualization of geological deposition", Computers Geosciences, vol. 67, Jun. 30, 2014, pp. 40-48.
Ott, F. et al., "The OnHW Dataset: Online Handwriting Recognition from IMU-Enhanced Ballpoint Pens with Machine Learning", Proceedings Of The ACM On Interactive, Mobile, Wearable And Ubiquitous Technologies, vol. 4, No. 3, Sep. 4, 2020, pp. 1-20.
Seifert et al., "Autocomplete Sketch Tool", Georgia Institute of Technology, Advanced Computer Vision, Retrieved from https://faculty.cc.gatech.edu/~hays/7476/projects/Sam.pdf, 2016, 05 pages.
ShadowDraw, "Learn to draw beautiful art in minutes", retrieved from https://www.shadowdrawapp.com/, Retrieved on Nov. 13, 2024, 07 pages.
Yun Xiao-Long et al., "Online Handwritten Diagram Recognition with Graph Attention Networks", Nov. 28, 2019, Nov. 28, 2019, pp. 232-244, XP047529260, [retrieved on Nov. 28, 2019].
Zulqurnain et al., "Enhanced Auto Completion of Hand Drawn Sketches", Journal of Independent Studies and Research, vol. 14, Jul. 2-Dec. 2016, 09 pages.

* cited by examiner

PREDICTIVE GEOLOGICAL DRAWING SYSTEM AND METHOD

CROSS-REFERENCE TO RELATED APPLICATIONS

This application is the National Stage Entry of International Application No. PCT/US2021/072980, filed on Dec. 17, 2021, which claims priority to U.S. Provisional Patent Application having Ser. No. 63/199,273, which was filed on Dec. 17, 2020 and is incorporated herein by reference in its entirety.

BACKGROUND

Geologists generally sketch geological data using a pen or pencil and a sketch book. For example, geologists may sketch domain-specific objects such as sedimentological logs, stratigraphic triangles, bioform symbols, landscapes, tool string schemas, and the like. Different people have different drawing abilities, and thus the sketches they produce, even of the same scene, may not be the same. Thus, harmonizing the sketches can prove difficult.

Presently, there are tools that permit a user to click through to select different characteristics of portions (e.g., depth interval, grain size, etc.) of a domain-specific object. However, this is a break from the intuitive drawing process that geologists generally employ and may generally slow the process of the geologists recording observations.

SUMMARY

Embodiments of the disclosure include a method for representing a geology, which includes receiving one or more drawing strokes from a user, the one or more drawing strokes as part of a geological feature sketch, predicting, using a machine learning model, one or more predicted geological features based at least in part on the one or more drawing strokes before the sketch is complete, displaying the one or more predicted geological features, receiving a selection of one of the one or more predicted geological features, and generating an image representing the geology including a digital representation of the selected one of the one or more predicted geological features.

In an embodiment, receiving the one or more drawing strokes includes receiving metadata representing the one or more drawing strokes, and predicting the one or more predicted geological features is based at least in part on the metadata.

In an embodiment, the metadata includes an order in which the one or more drawing strokes are received.

In an embodiment, the geological feature sketch at least partially represents a rock layer, and the method further includes determining a depth interval of the rock layer in the image based on a position of the one or more drawing strokes, and generating the image includes adding the rock layer into the image at a location that represents the depth interval.

In an embodiment, the method further includes receiving one or more additional drawing strokes after receiving the one or more drawing strokes, the one or more additional drawing strokes being entered also as part of the geological feature sketch, and updating the one or more predicted geological features based at least in part on the one or more additional drawing strokes in combination with the one or more drawing strokes.

In an embodiment, the method further includes displaying a representation of a known geological feature to a plurality of training users, receiving training geological feature sketches from the plurality of training users, and training the machine learning model based at least in part on the training geological feature sketches.

In an embodiment, receiving the training geological feature sketches includes receiving point location data, timestamp data, data representing an order in which drawing strokes were entered, and pressure data, and training the machine learning model includes training the machine learning model based at least in part on the point location data, the timestamp data, the data representing an order in which drawing strokes were entered, and the pressure data. In a further embodiment, a computer program is provided that comprises instructions for implementing any one of the foregoing methods in this summary section.

Embodiments of the disclosure also include a non-transitory, computer-readable medium storing instructions that, when executed by at least one processor of a computing system, cause the computing system to perform operations, the operations including receiving one or more drawing strokes as part of a geological feature sketch, predicting, using a machine learning model, one or more predicted geological features based at least in part on the one or more drawing strokes before the sketch is complete, displaying the one or more predicted geological features, receiving a selection of one of the one or more predicted geological features, and generating an image representing the geology including a digital representation of the selected one of the one or more predicted geological features.

Embodiments of the disclosure further include a computing system, which includes one or more processors and a memory system including one or more non-transitory, computer-readable media storing instructions that, when executed by at least one of the one or more processors, cause the computing system to perform operations, the operations including receiving one or more drawing strokes as part of a geological feature sketch, predicting, using a machine learning model, one or more predicted geological features based at least in part on the one or more drawing strokes before the sketch is complete, displaying the one or more predicted geological features, receiving a selection of one of the one or more predicted geological features, and generating an image representing the geology including a digital representation of the selected one of the one or more predicted geological features.

Embodiments of the disclosure further include a computing system configured to receive one or more drawing strokes as part of a geological feature sketch, predict, using a machine learning model, one or more predicted geological features based at least in part on the one or more drawing strokes before the sketch is complete, display the one or more predicted geological features, receive a selection of one of the one or more predicted geological features, and generate an image representing the geology including a digital representation of the selected one of the one or more predicted geological features.

Embodiments of the disclosure further include a computing system, which includes means for receiving one or more drawing strokes as part of a geological feature sketch, means for predicting, using a machine learning model, one or more predicted geological features based at least in part on the one or more drawing strokes before the sketch is complete, means for displaying the one or more predicted geological features, means for receiving a selection of one of the one or more predicted geological features, and means for generating an image representing the geology including a digital representation of the selected one of the one or more predicted geological features.

Thus, the computing systems and methods disclosed herein are more effective methods for processing collected data that may, for example, correspond to a surface and a subsurface region. These computing systems and methods increase data processing effectiveness, efficiency, and accuracy. Such methods and computing systems may complement or replace conventional methods for processing collected data. This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

The accompanying drawings, which are incorporated in and constitute a part of this specification, illustrate embodiments of the present teachings and together with the description, serve to explain the principles of the present teachings. In the figures.

DETAILED DESCRIPTION

Reference will now be made in detail to embodiments, examples of which are illustrated in the accompanying drawings and figures. In the following detailed description, numerous specific details are set forth in order to provide a thorough understanding of the invention. However, it will be apparent to one of ordinary skill in the art that the invention may be practiced without these specific details. In other instances, well-known methods, procedures, components, circuits, and networks have not been described in detail so as not to unnecessarily obscure aspects of the embodiments.

It will also be understood that, although the terms first, second, etc. may be used herein to describe various elements, these elements should not be limited by these terms. These terms are only used to distinguish one element from another. For example, a first object or step could be termed a second object or step, and, similarly, a second object or step could be termed a first object or step, without departing from the scope of the present disclosure. The first object or step, and the second object or step, are both, objects or steps, respectively, but they are not to be considered the same object or step.

The terminology used in the description herein is for the purpose of describing particular embodiments and is not intended to be limiting. As used in this description and the appended claims, the singular forms "a," "an" and "the" are intended to include the plural forms as well, unless the context clearly indicates otherwise. It will also be understood that the term "and/or" as used herein refers to and encompasses any possible combinations of one or more of the associated listed items. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, as used herein, the term "if" may be construed to mean "when" or "upon" or "in response to determining" or "in response to detecting," depending on the context.

Attention is now directed to processing procedures, methods, techniques, and workflows that are in accordance with some embodiments. Some operations in the processing procedures, methods, techniques, and workflows disclosed herein may be combined and/or the order of some operations may be changed.

Figure 1:
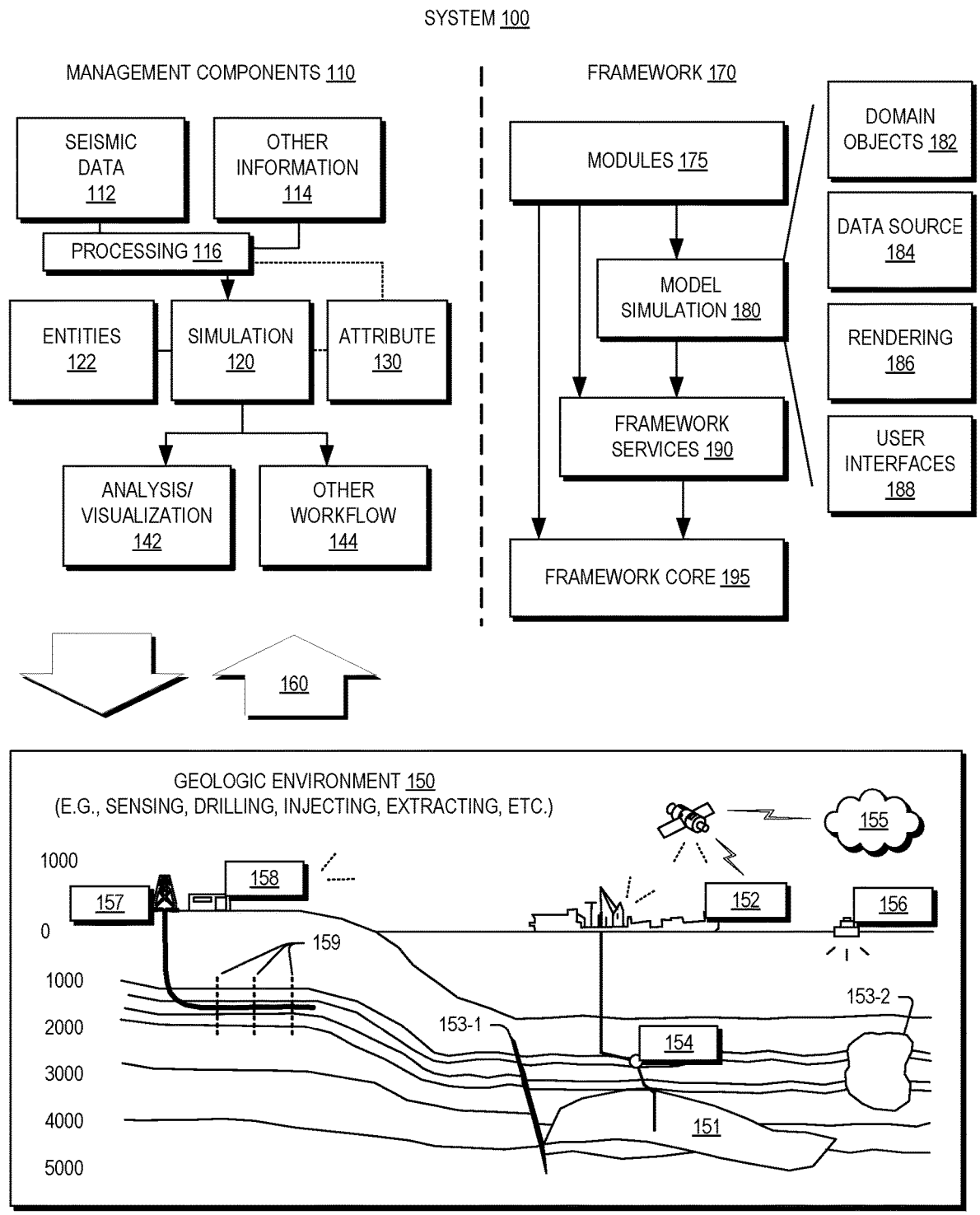
FIG. 1 illustrates an example of a system that includes various management components to manage various aspects of a geologic environment, according to an embodiment.

FIG. 1 illustrates an example of a system 100 that includes various management components 110 to manage various aspects of a geologic environment 150 (e.g., an environment that includes a sedimentary basin, a reservoir 151, one or more faults 153-1, one or more geobodies 153-2, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142 and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, bodies, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may operate in conjunction with a software framework such as an object-based framework. In such a framework, entities may include entities based on pre-defined classes to facilitate modeling and simulation. A commercially available example of an object-based framework is the MICROSOFT® .NET® framework (Redmond, Washington), which provides a set of extensible object classes. In the .NET® framework, an object class encapsulates a module of reusable code and associated data structures. Object classes can be used to instantiate object instances for use in by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results (e.g., simulation results, etc.). As an example, output from the simulation component 120 may be input to one or more other workflows, as indicated by a workflow component 144.

As an example, the simulation component 120 may include one or more features of a simulator such as the ECLIPSE™ reservoir simulator (Schlumberger Limited, Houston Texas), the INTERSECT™ reservoir simulator (Schlumberger Limited, Houston Texas), etc. As an example, a simulation component, a simulator, etc. may include features to implement one or more meshless techniques (e.g., to solve one or more equations, etc.). As an example, a reservoir or reservoirs may be simulated with respect to one or more enhanced recovery techniques (e.g., consider a thermal process such as SAGD, etc.).

In an example embodiment, the management components 110 may include features of a commercially available framework such as the PETREL® seismic to simulation software framework (Schlumberger Limited, Houston, Texas). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of modeling, simulating, etc.).

In an example embodiment, various aspects of the management components 110 may include add-ons or plug-ins that operate according to specifications of a framework environment. For example, a commercially available framework environment marketed as the OCEAN® framework environment (Schlumberger Limited, Houston, Texas) allows for integration of add-ons (or plug-ins) into a PETREL® framework workflow. The OCEAN® framework environment leverages .NET® tools (Microsoft Corporation, Redmond, Washington) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization.

As an example, a framework may include features for implementing one or more mesh generation techniques. For example, a framework may include an input component for receipt of information from interpretation of seismic data, one or more attributes based at least in part on seismic data, log data, image data, etc. Such a framework may include a mesh generation component that processes input information, optionally in conjunction with other information, to generate a mesh.

In the example of FIG. 1, the model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

As an example, the domain objects 182 can include entity objects, property objects and optionally other objects. Entity objects may be used to geometrically represent wells, surfaces, bodies, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may include layers (e.g., stratification) that include a reservoir 151 and one or more other features such as the fault 153-1, the geobody 153-2, etc. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally or instead include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL® software, for example, that operates on seismic data, seismic attribute(s), etc. As an example, a workflow may be a process implementable in the OCEAN® framework. As an example, a workflow may include one or more worksteps that access a module such as a plug-in (e.g., external executable code, etc.).

Figure 2:
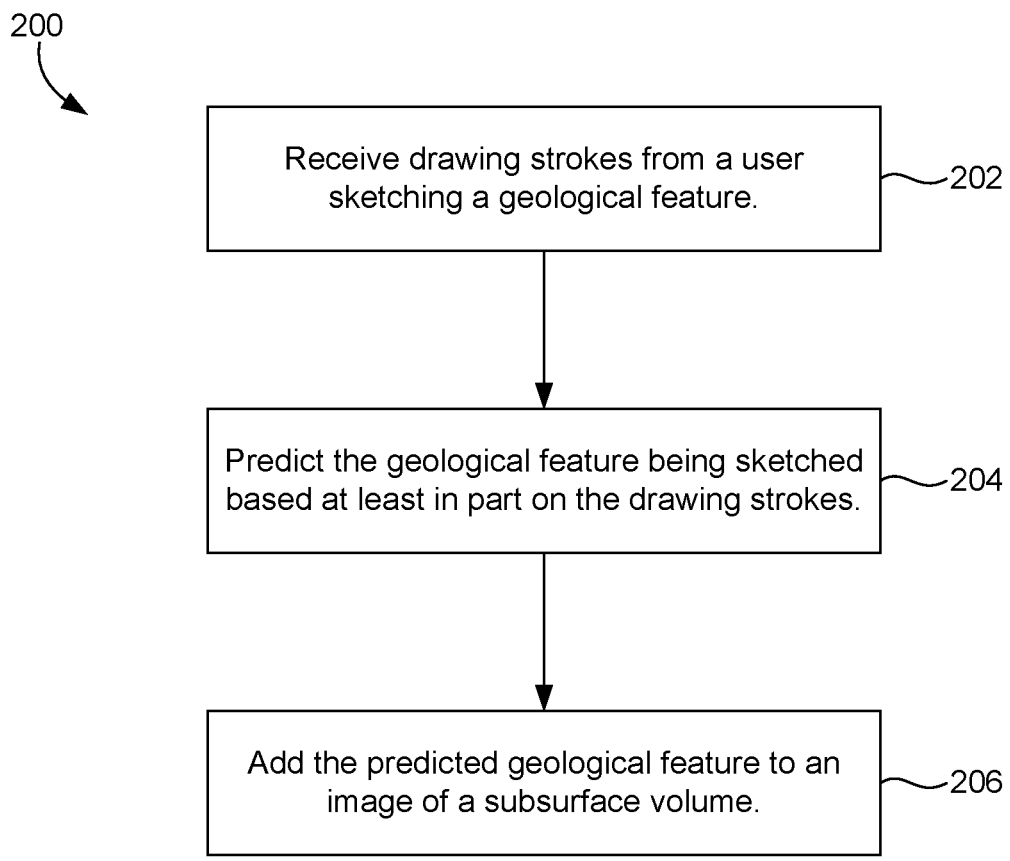
FIG. 2 illustrates a flowchart of a method for representing a geology, according to an embodiment.
Figure 3:
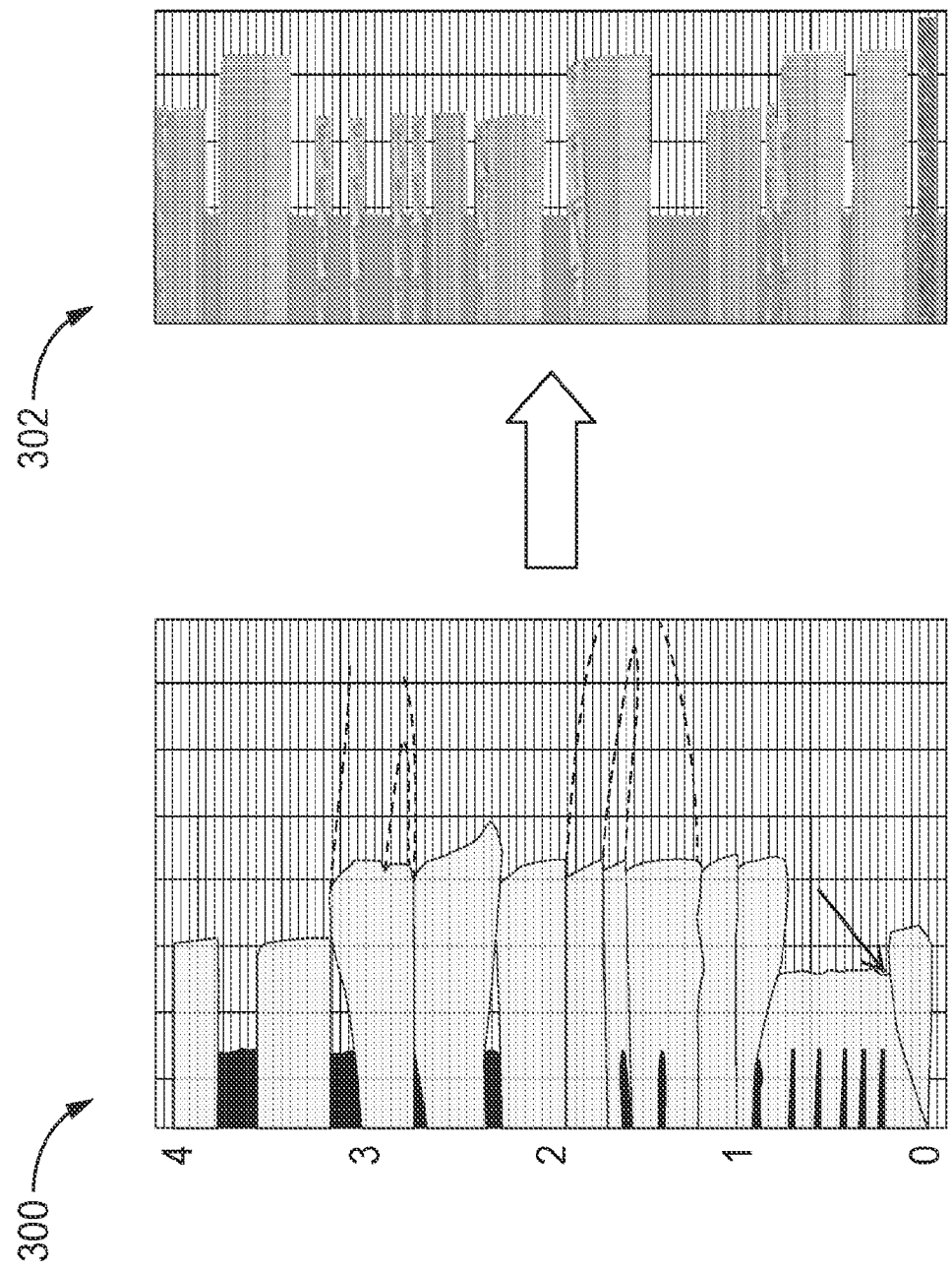
FIG. 3 illustrates an input to and an output from the method, according to an embodiment.

FIG. 2 illustrates a flowchart of a method 200 for displaying a geology, according to an embodiment. FIG. 3 illustrates an example of input 300 to and output 302 from the method 200, according to an embodiment. As shown in FIG. 2, the method 200 may begin by receiving drawing strokes from a user, as at 202, e.g., as the user is sketching a geological feature. Geological features may include lithologies and symbols. Lithologies provide a description of rock properties, e.g., mineralogical and/or biological content, color, texture, grain size, etc. Such lithologies may be represented using certain standardized patterns and/or symbols. Further, geological features may include sedimentary structures, which correspond to various features related to depositional time and dynamic, such as grain size sorting, bedding type, top and bottom features, etc.

In the illustrated sketch input 300, depth intervals (along the vertical axis) are shown, along with grain size (horizontal axis). The sketch input 300 may represent a completed sketch of at least a portion (e.g., one or more layers) of the geology, and may be formed by one or more drawing strokes. Drawing strokes may be entered using a computing device that may track the position (e.g., X and Y coordinates) or location of "points" of the implement (e.g., mouse, digital pen/pad) used to make the stroke. The points location data may be combined with timestamps and pressure data to define lines (strokes) entered by the user. Further, other metadata about the stroke may include direction and order in which the drawing strokes were entered. This metadata for the drawing strokes may be used to establish patterns for drawings, as users may tend to input certain types of features in a same or similar repeating order.

Based on the drawing strokes (and, e.g., while the drawing strokes are being entered) and the metadata associated therewith, the method 200 may include predicting a digital representation of a geological feature, as at 204. In some embodiments, several different digital representations of the geological feature (or several different geological features) may be predicted. As the drawing strokes continue to be entered, the method 200 may include revising the prediction. In embodiments in which several representations or features are predicted, the method 200 may include displaying two or more of such representations or features to a user for selection.

Accordingly, the method 200 may including adding at least one representation of a predicted geological feature to an image of a subsurface volume, as at 206. For example, as shown in FIG. 3, the output digital image 302 may be produced. The output digital image 302 may include precise depth boundaries and other features (grain size, lithology, sedimentary structures), which may be determined based on the drawing strokes and digitized for retrieval by subsequent users. The predicted, and now added, digital representations of the geological features may thus specify and represent grain size, lithology, sedimentary structures (e.g., internal/within a layer, or external, boundary geometry information about a given layer) or other characteristics, which may permit ready access to the characteristics of the geology, e.g., through searching in a database, etc.

Figure 4:
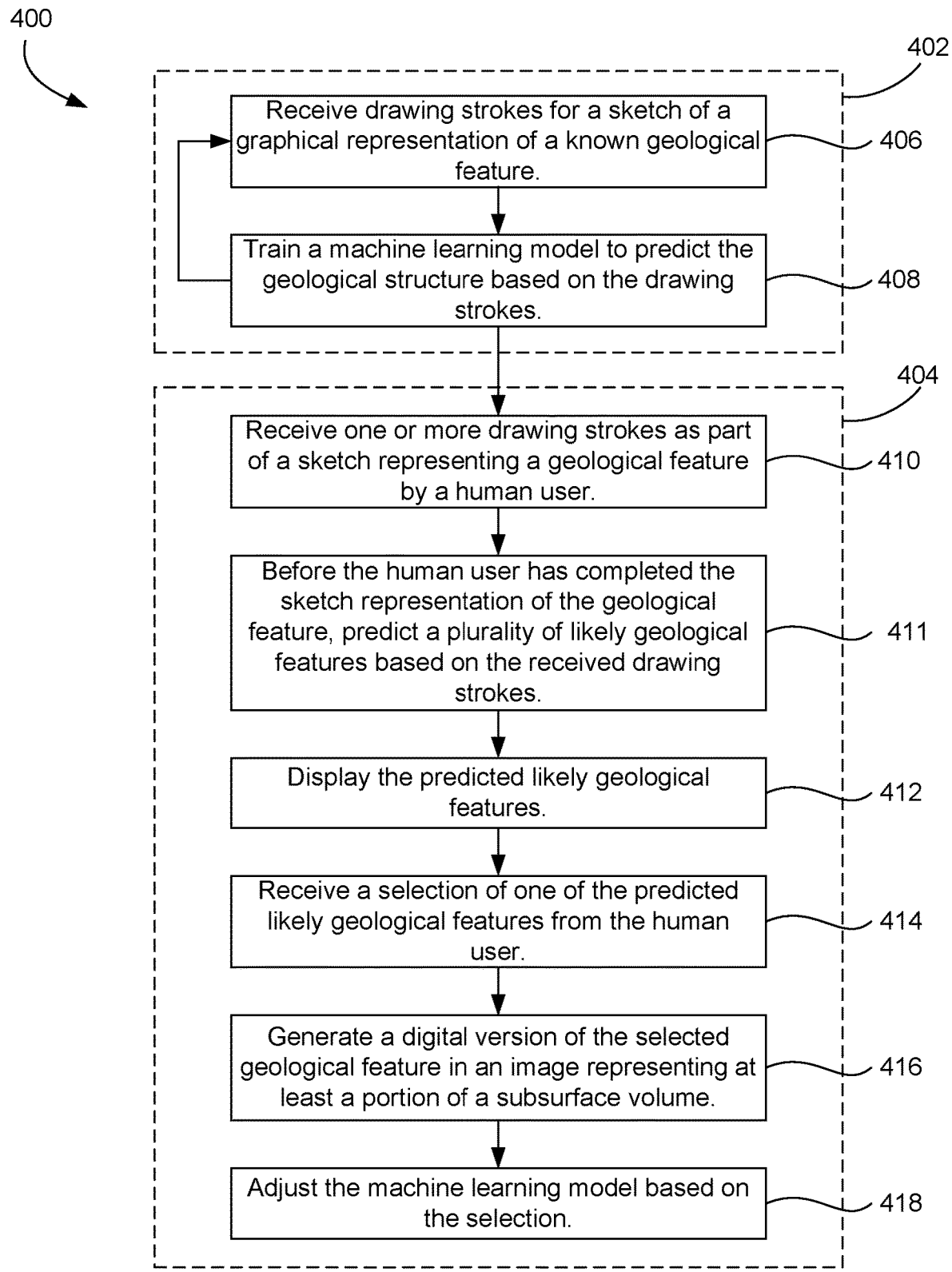
FIG. 4 illustrates a flowchart of another method for representing a geology, according to an embodiment.

FIG. 4 illustrates a flowchart of another method 400 for representing a geology, according to an embodiment. The method 400 may include a training phase 402 and an implementation phase 404. The training phase 402 may generally include training a machine learning model to make predictions about what a user is drawing, based on the drawing strokes, potentially before the user completes the drawing. Once trained, the machine learning model may be used to make the predictions and build a digital image of a subsurface domain in the implementation phase 404.

The training phase 402 may begin by receiving drawing strokes for a sketch of a known geological feature (e.g., a prompt for a user to draw), as at 406. A geological feature may be one or more rock layers. A rock layer may occupy a (e.g., vertical) depth interval and may be discernable from adjacent layers by differences in rock type or other characteristics, such that boundaries are formed therebetween. Embodiments of the present methods may also be implemented for other types of geological features.

The drawing strokes may be received in a computing device. The computing device may store the location and direction of the drawing strokes, as well as various other metadata about the strokes, such as the pressure with which the user applied with a pen or stylus to create the drawing strokes and the order in which the strokes were made versus other strokes. Once the sketch is complete, the strokes that were used to make the sketch may be paired with the known geological feature, and a connection may be established in the machine learning model between the sketch and its associated strokes (and metadata related to the strokes), and the known geological feature and characteristics related thereto (e.g., depth, grain size, lithology, internal/external geometry, etc.). This may be referred to as "training" the machine learning model to predict the geological structure based on the drawing strokes, as indicated at 408. Various different types of machine learning models (e.g., neural networks) may be employed consistent with the present disclosure.

The training process of boxes 406 and 408 may be repeated, potentially many times. Moreover, several different groups of people may be employed to establish a training data set ("corpus"). For example, geoscience students and professionals may be used as a source of sketches and drawing strokes. Geoscience students and geoscientists may tend to provide detailed and accurate sketches, since they are trained to create such sketches. Accordingly, the geoscientists and students may be given a prompt (e.g., a picture of a known feature) and asked to sketch it, and relationships formed between the geoscientists/students' work and the known feature.

To provide more robust predictions, which may not rely on such high-quality input, other groups of people may be used additionally or instead to generate the training material. For example, engineers in other disciplines, the general public, and even children may be used. These groups may bring "noise" into the drawings, and thus relationships may be established through this noise.

Figure 5:
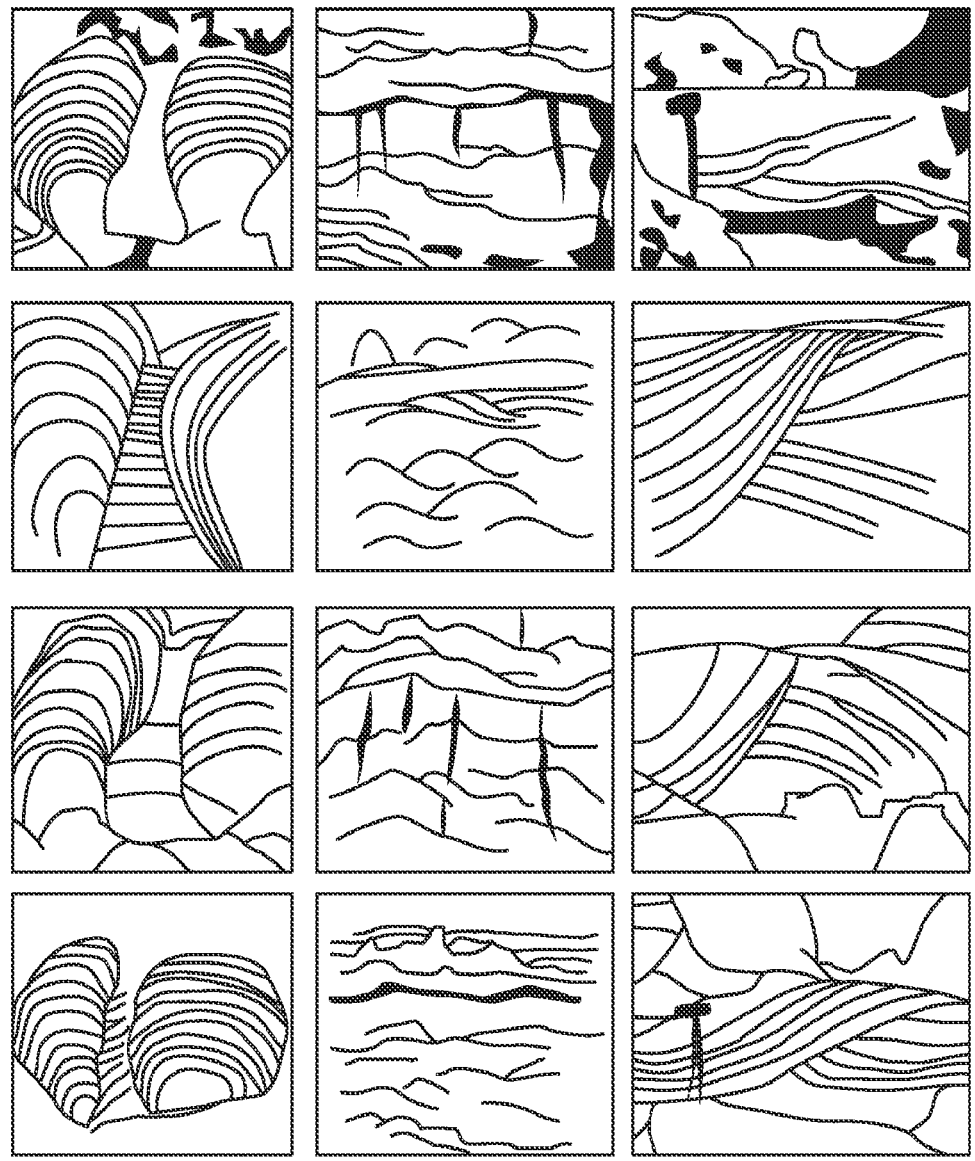
FIG. 5 illustrates a training template for acquiring geological feature sketches to train a machine learning model, according to an embodiment.

Hundreds or even thousands or more of these training relationships from any number of different types of people may be used to train the machine learning model. FIG. 5 illustrates an example of a training template that may be used to connect sketches with known geological features. As shown, the top row may include detailed depictions of a known geological feature, e.g., a prompt. The next three rows show views of sketches of those top-row depictions, e.g., by different people, groups, etc.

Moreover, the order in which the different drawing strokes were input, the pressure applied, etc., may also be documented and used to establish the relationships. Further, in some examples, such relationships may be or include a "dynamic" relationship. For example, a relationship may be weighted using a number (e.g., from a Fibbonacci suite) to provide a notion of distance between the two related objects. For example, predictions may be more heavily influenced by one characteristic (or metadata) of the drawing versus another characteristic. In a specific example, the layer recognition may more heavily weight the order/sequence of strokes, than the "group of origin" of the person making the drawing.

Figure 6:
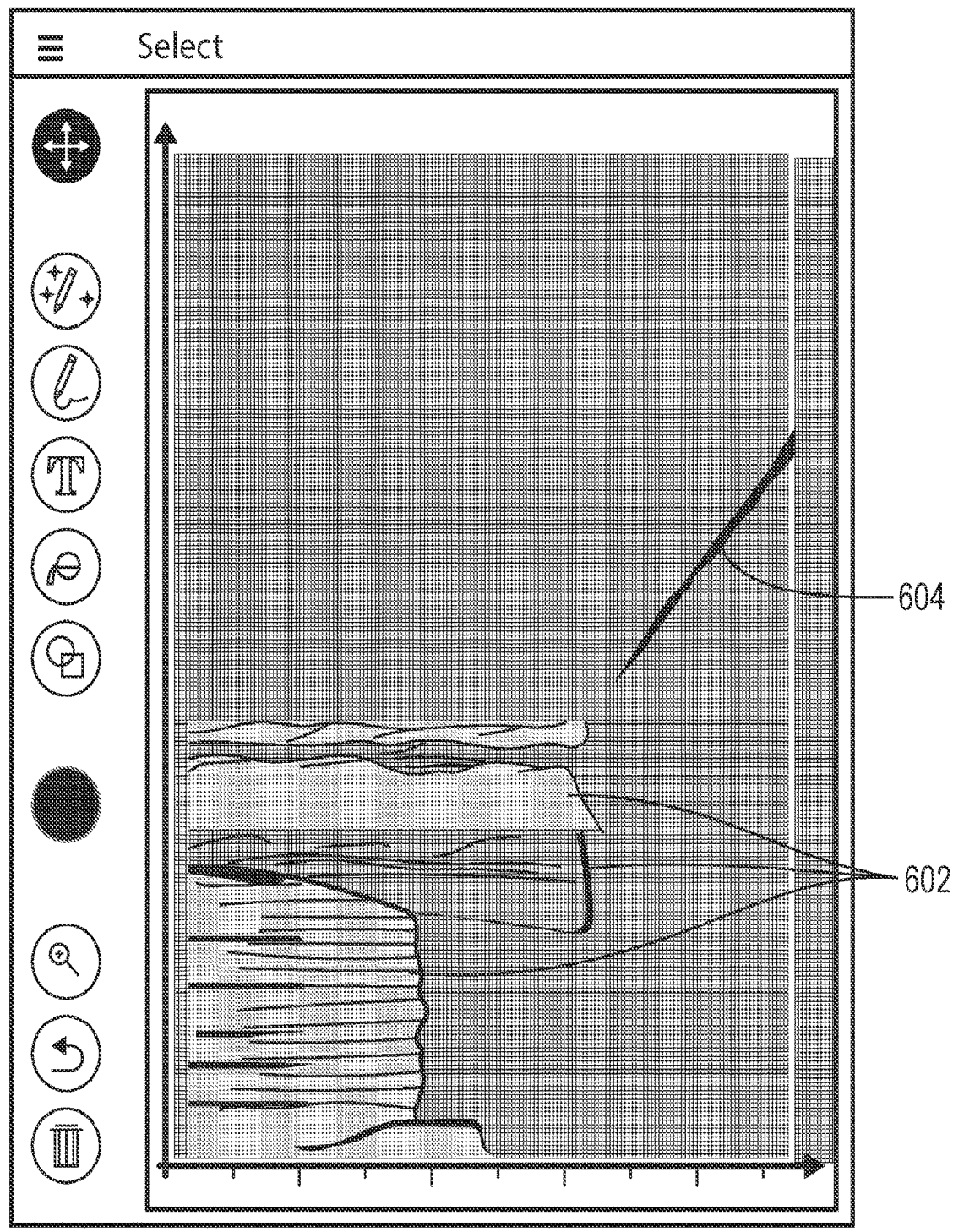
FIG. 6 illustrates a display including input drawing strokes received as part of a geological feature sketch from a user, according to an embodiment.

Returning to FIG. 4 and moving on to the implementation phase 404, the method 400 may include receiving one or more drawing strokes, as part of a sketch representing a geological feature, made by a human user, as at 410. The drawing strokes may be received using an input interface, such as a touch screen, stylus, etc. FIG. 6 illustrates an example of such a display 600 with a partially completed sketch of a subsurface domain showing several geological layers 602. In particular, the display 600 may interact with a stylus 604 to create the drawings, both on paper and in digital form, for example. The layers 602 are drawn with symbols therein and along a depth interval (vertical axis), which may be taken into consideration by the machine learning model, e.g., to establish rock type, internal geometry, etc. The horizontal axis, in this depiction, shows the grain size of the rock in the various layers 602 and may also be taken into consideration by the machine learning model, e.g., to establish rock type, internal geometry, etc.

The thickness of a layer may also be used to recognize a depositional environment that created it. For example, contourites, deep marine basin deposits, may not be more than a few decimeters thick, while turbidites, very close to it (even sometimes inter-digited with it) may be several meters or more thick.

The vertical sequence/ordering of the sedimentary structures (internal and external) may facilitate defining the depositional environment, as well as enhance the machine learning process. For example, some sedimentary sequences may be unusual, while others may not exist, and thus the machine learning model may be constructed to avoid suggesting unrealistic or unlikely layers.

Before the human user has completed the sketch, e.g., after forming at least part of one of the layers 602, the method 400 may include predicting a plurality of likely geological features based on the receive drawing strokes, as at 411. For example, the method 400 may predict the characteristics of the layer 602 currently being drawn by the user. These predictions may be made using the machine learning model and based on the position, order, pressure, and/or any other aspects of the drawing strokes. The predictions may provide several options for characteristics of the geological feature (e.g., grain size, lithology, structure, geometry, etc.) that may be likely based on the drawing stroke(s) entered to this point. Further, the method 400 may include continuing to receive drawing strokes and updating the predictions as more strokes are received.

Figure 7:
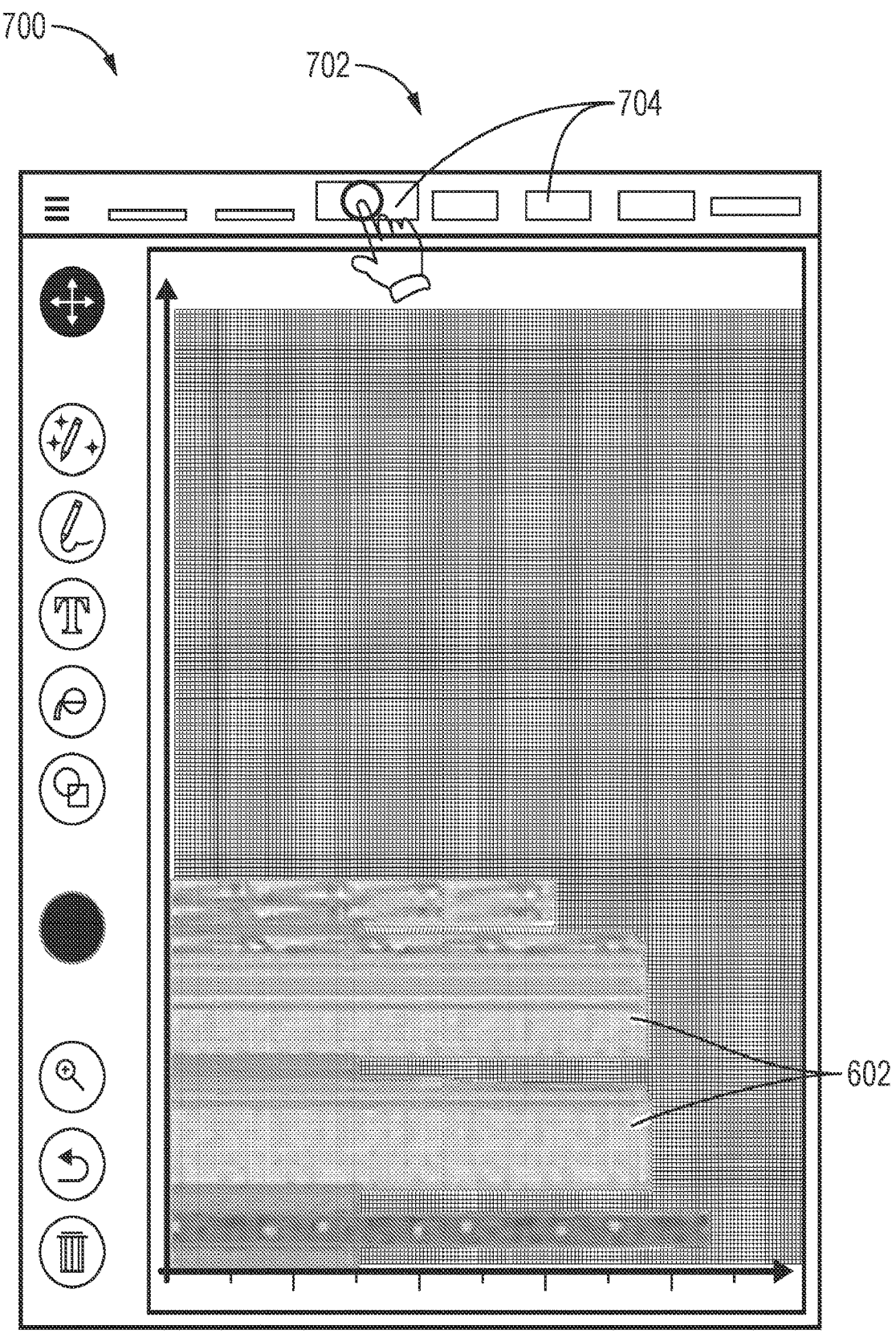
FIG. 7 illustrates a display of an image, incorporating digital representations of geological features formed at least partially by predicting geological features being sketched by the user, according to an embodiment.

The predictions may be displayed to the user, as at 412. For example, as shown in FIG. 7, a digital display 700 of (at least a portion of) the subsurface image is provided. A bar 702 of predictions may be presented across the top of the display 700. The displays 600, 700 may be part of the same display, adjacent displays, overlayed displays, etc. The bar 702 may include several different options of representations 704 for the layer 602 currently being drawn (e.g., in the display 600).

Next, the method 400 may include receiving a selection of one of the predicted geological features, as at 414. For example, a user may select one of the representations 704 provided in the bar 702 that matches the geological object (e.g., layer) that the user is currently sketching. As noted above, the user may continue to enter drawing strokes, and the method 400 may continue to receive the strokes, and metadata associated therewith, form new predictions, and adjust the representations 704 included in the bar 702 accordingly, e.g., as the user continues to draw, until one representation 704 is selected.

The method 400 may then include generating a digital version of the selected geological feature in the image representing at least a portion of the subsurface volume, as at 416. This is shown in FIG. 7, in which the display 700 shows the image including the digital representations of the geological features, e.g., predictions of the various layers 602 (which may be added to the image individually, one-by-one, or as a group forming a single geological feature). The method 400, as part of adding the selected geological feature to the image, may include determining a location (e.g., depth) for the newly-added feature. The depth may be selected based on a two-dimensional point sequence acquired from the user during the drawing, which may describe trajectories that permit placement of the sedimentological or lithological features in depth scale. Further, this depth positioning may be adjustable by the user, e.g., by dragging or otherwise modifying an anchor point (or points) of the selected representation of the geological feature.

Further, in response to the selection at 414, the method 400 may include adjusting the machine learning model, as at 418, e.g., such that one, some, or each input from a user serves to further train the model.

Figure 8A:
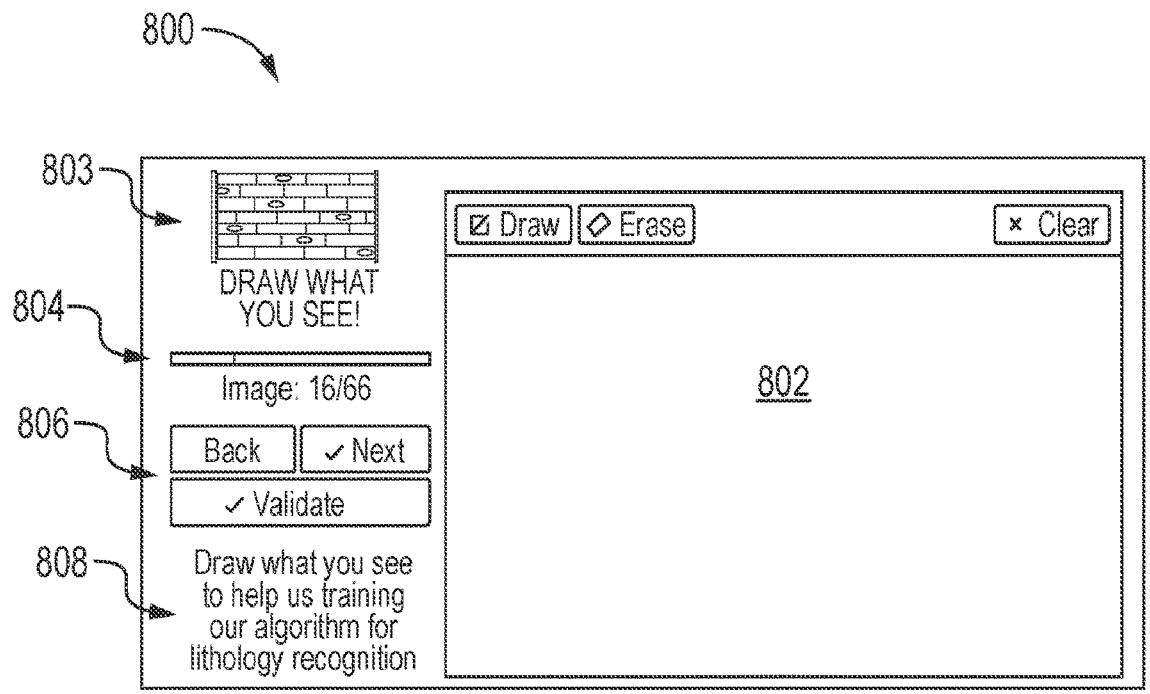
FIG. 8A illustrates a view of a user interface (e.g., a "web-app") that may be used to harvest training data from users, according to an embodiment.
Figure 8B:
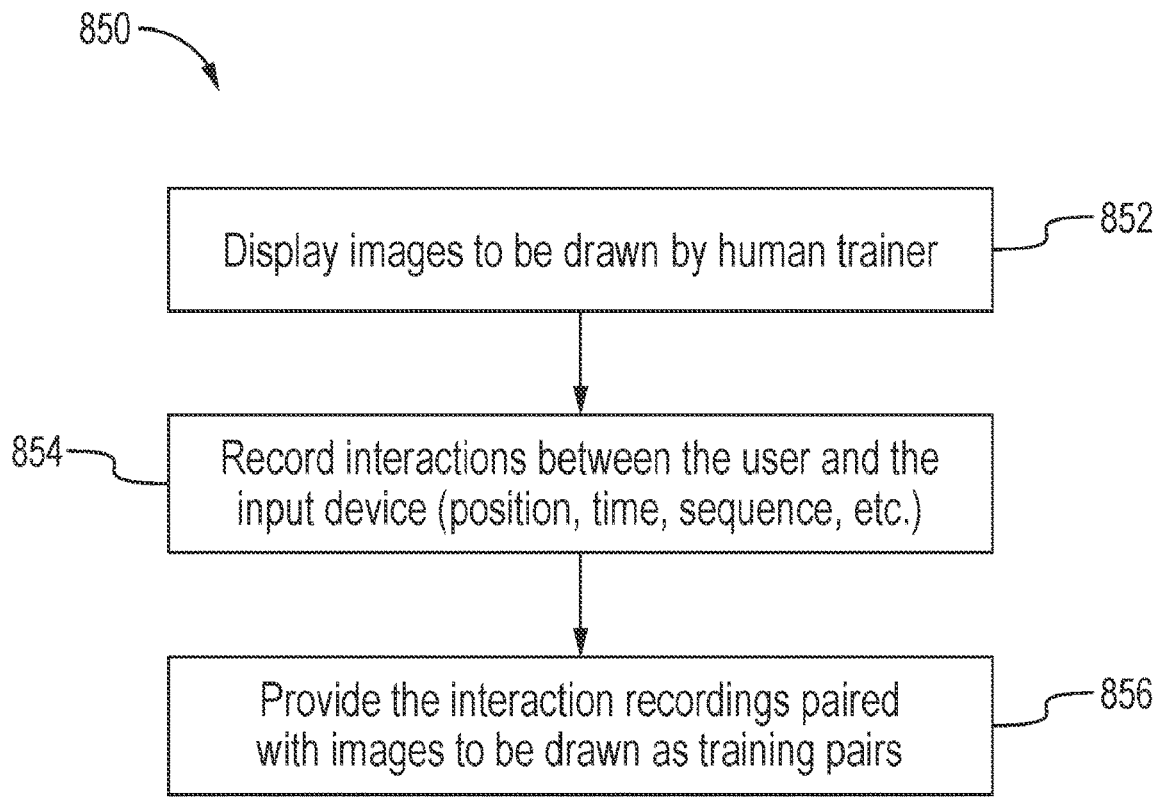
FIG. 8B illustrates a flowchart of a method for acquiring training data for a machine learning model, according to an embodiment.

FIGS. 8A and 8B illustrate aspects of the training phase 402 discussed above in greater detail, according to an embodiment. In particular, FIG. 8A illustrates a view of a user interface 800 (e.g., a "web-app") that may be used to harvest training data from users. The user interface 800 may include a drawing area 802, which may be configured to receive input from a user. For example, a user may manipulate a stylus on a drawing pad, a mouse cursor, etc., to draw a picture in the drawing area 802. The user interface 800 may also include a prompt 803, which may be or include a representation of a structure to draw. The structure provided by the prompt 803 may show a geological along with industry-specific symbols, or any other type of structure or item to be drawn.

The user interface 800 may also include a progress bar 804, one or more navigation buttons 806, and instructions 808. It will be appreciated that these are merely examples of what could be included in the user interface 800 and various other features could be added as part of the display and/or omitted from the display.

FIG. 8B illustrates a flowchart of a method 850 for acquiring training data for a machine learning model, according to an embodiment. The method 850 may employ the user interface 800 or any other interactive display, input capture device, etc. The method 850 may include displaying images to be drawn (e.g., in the drawing area 802) by a human trainer, as at 852. For example, known geological structures may be provided to the user in the prompt 803 for the user to draw in the drawing area 802.

The method 850 may then include recording interactions between the user and the input device (e.g., stylus/drawing pad, mouse, etc.), as at 854. The recorded data may include point location data, timestamp data, data representing an order in which drawing strokes were entered, and pressure data representing the application of pressure to the input device during the drawing sequence. The method 850 may also include providing the interaction recordings paired with the images to be drawn as training pairs, as at 856. Thus, the images of the known geological structures that were drawn may provide ground truth data for the recordings, which may be employed to train a machine learning model to predict geological features associated with (e.g., partial) subsequent drawings.

Figure 9A:
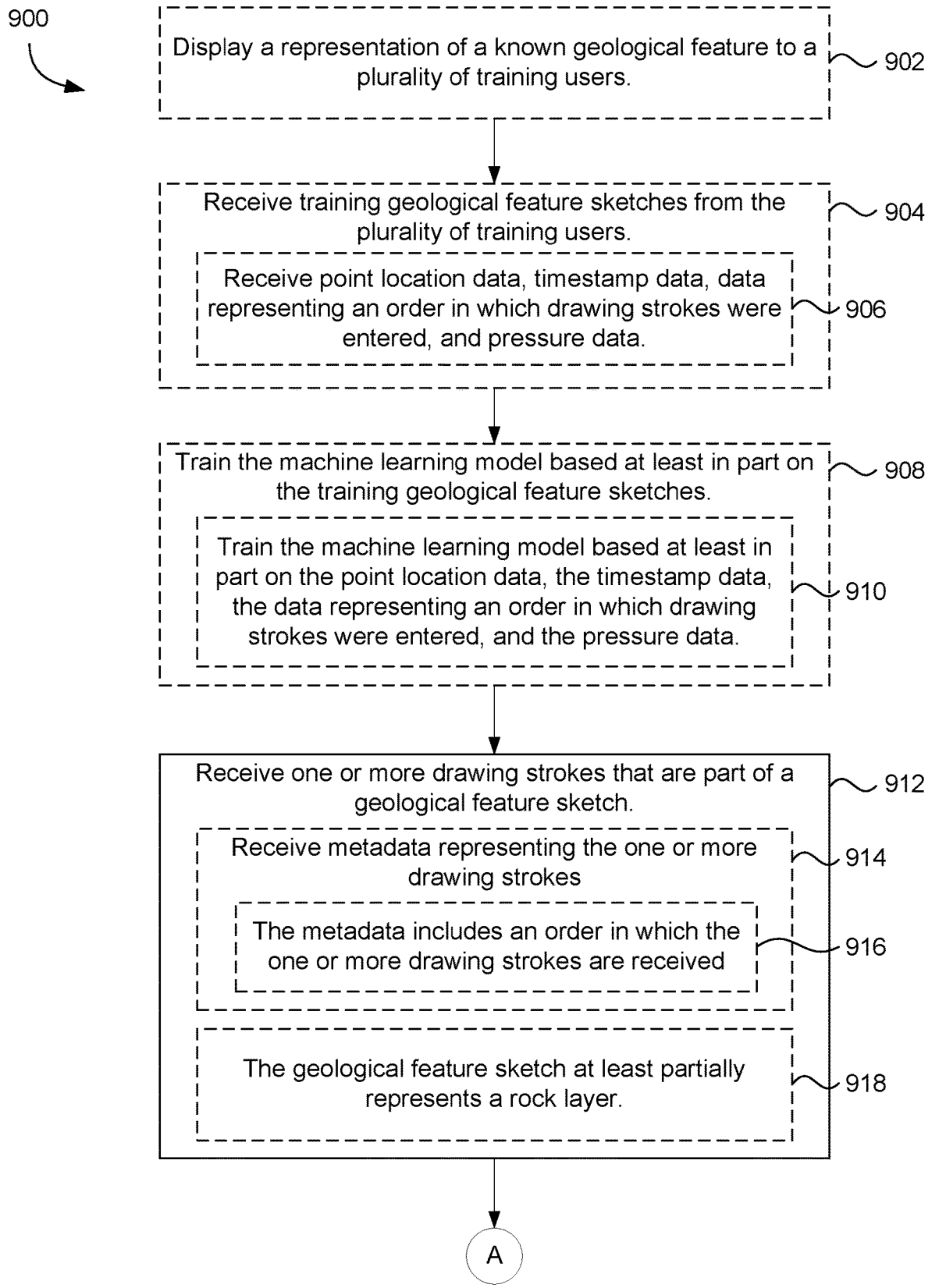
FIGS. 9A, 9B, and 9C illustrate a flowchart of a method for representing a geology, according to an embodiment.
Figure 9B:
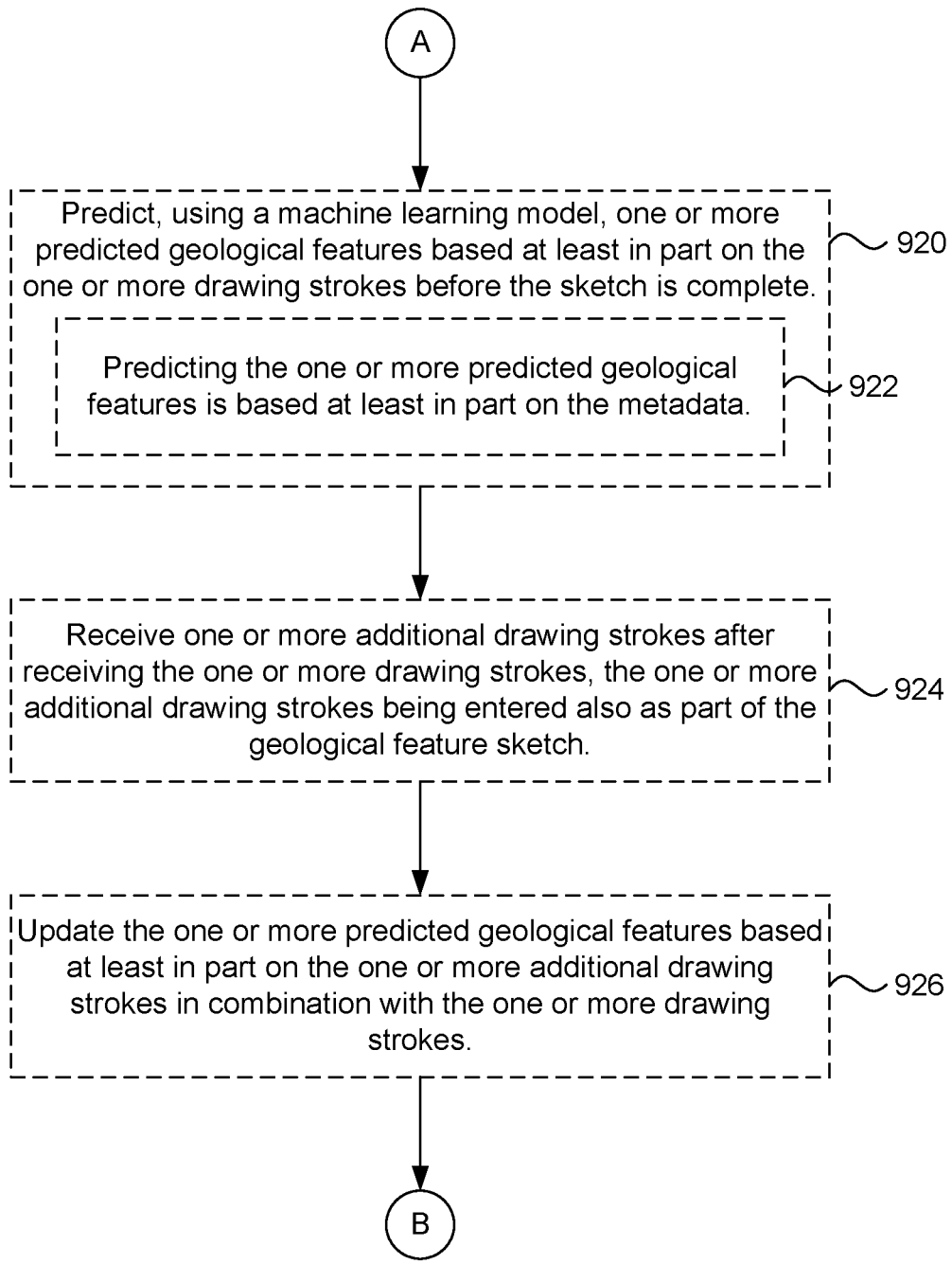
Figure 9C:
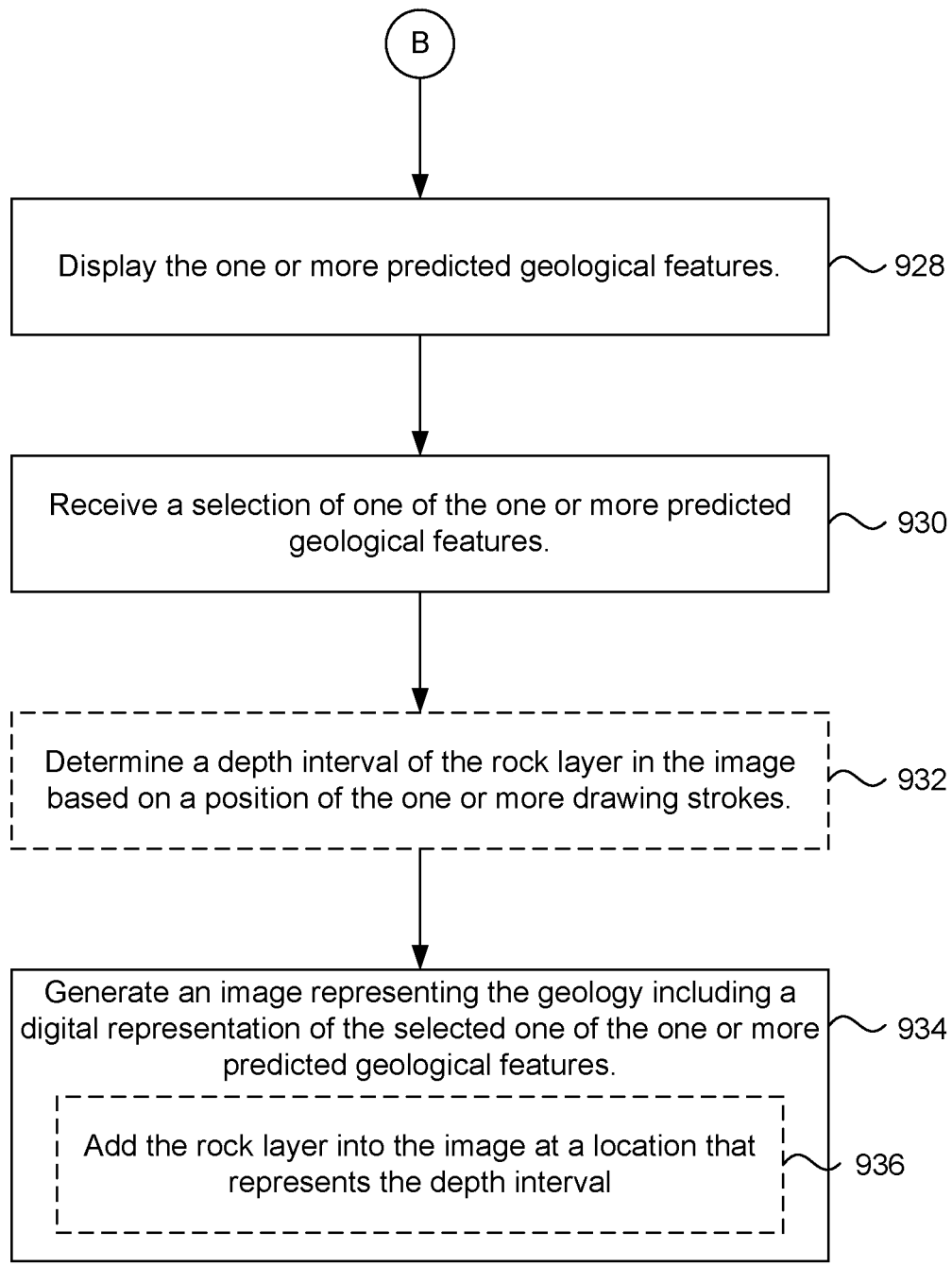

FIGS. 9A, 9B, and 9C illustrate a flowchart of a method 900 for representing a geology, according to an embodiment. It will be appreciated that each of the methods 200, 400, 850, and 900 may be performed in the order presented and described herein, or in any other order. Further, various actions of the methods discussed herein may be combined into a single action or performed in parallel. Further, any individual action may be partitioned into two or more actions.

The method 900 includes displaying a representation of a known geological feature to a plurality of training users, as at 902 (e.g., FIG. 8B, block 852). The method 900 also includes receiving training geological feature sketches from the plurality of training users, as at 904 (e.g., FIG. 8B, block 854; FIG. 2, block 406). In an embodiment, receiving the training geological feature sketches includes receiving point location data, timestamp data, data representing an order in which drawing strokes were entered, and pressure data, as at 906.

The method 900 may also include training the machine learning model based at least in part on the training geological feature sketches, as at 908 (e.g., FIG. 4, block 408). Further, training the machine learning model may be based at least in part on the point location data, the timestamp data, the data representing an order in which drawing strokes were entered, and the pressure data, as at 910.

The method 900 also includes receiving one or more drawing strokes that are part of a geological feature sketch, as at 912 (e.g., FIG. 4, block 410). In an embodiment, receiving the one or more drawing strokes includes receiving metadata representing the one or more drawing strokes, as at 914. The metadata may include an order in which the one or more drawing strokes are received, as at 916. In some embodiments, the geological feature sketch at least partially represents a rock layer, as at 918.

The method 900 may include predicting, using a machine learning model, one or more predicted geological features based at least in part on the one or more drawing strokes before the sketch is complete, as at 920 (e.g., FIG. 4, block 411). In an embodiment, predicting the one or more predicted geological features is based at least in part on the metadata, as at 922.

The method 900 may further include receiving one or more additional drawing strokes after receiving the one or more drawing strokes, the one or more additional drawing strokes being entered also as part of the geological feature sketch, as at 924. The method 900 may also include updating the one or more predicted geological features based at least in part on the one or more additional drawing strokes in combination with the one or more drawing strokes, as at 926.

The method 900 may include displaying the one or more predicted geological features, as at 928 (e.g., FIG. 4, block 412). The method 900 may include receiving a selection of one of the one or more predicted geological features, as at 930 (e.g., FIG. 4, block 414). The method 900 further includes determining a depth interval of the rock layer in the image based on a position of the one or more drawing strokes, as at 932. The method 900 may include generating an image representing the geology including a digital representation of the selected one of the one or more predicted geological features, as at 934. In an embodiment, generating the image includes adding the rock layer into the image at a location that represents the depth interval, as at 936.

Figure 10:
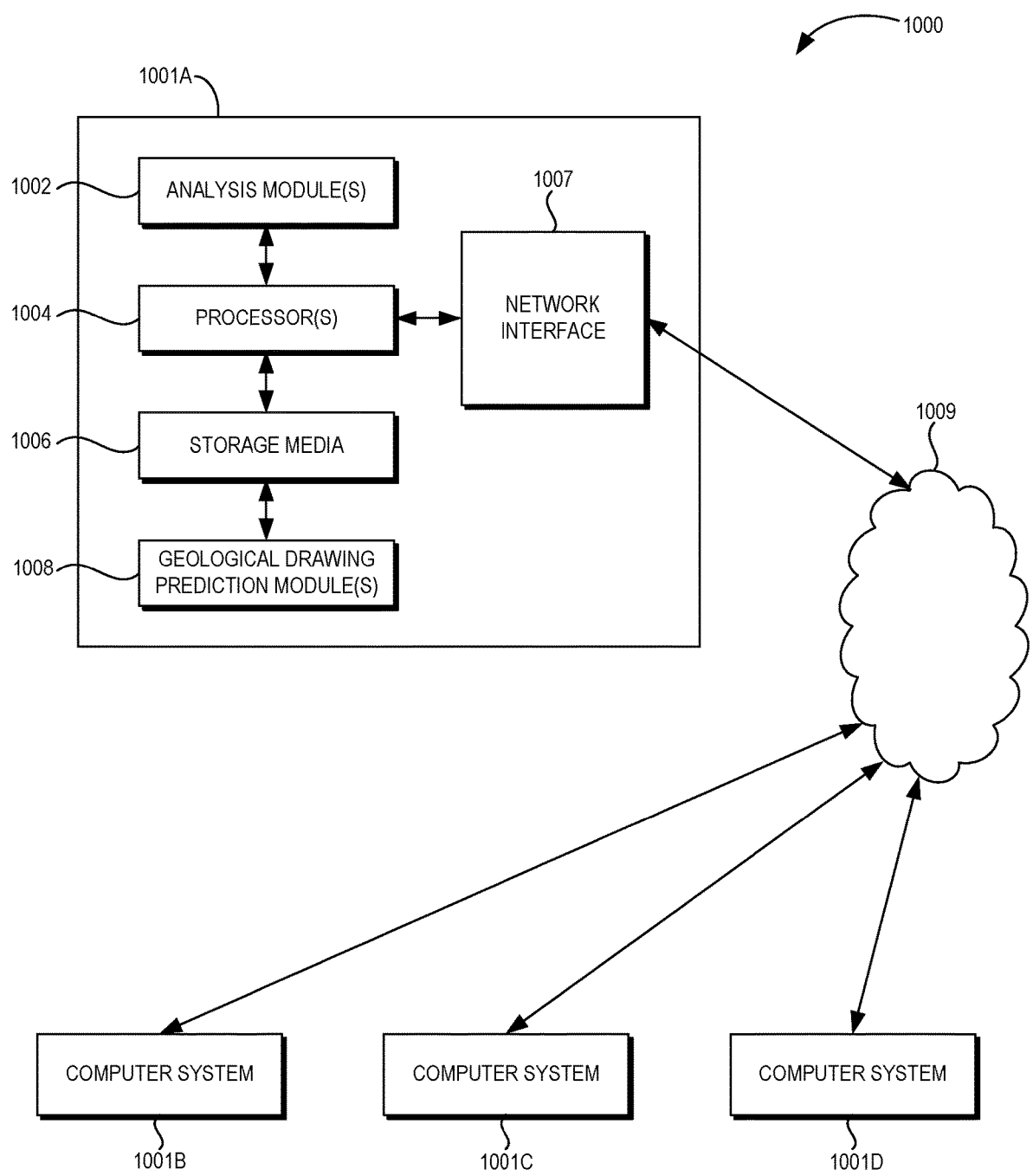
FIG. 10 illustrates a schematic view of a computing system, according to an embodiment.

In some embodiments, the methods of the present disclosure may be executed by a computing system. FIG. 10 illustrates an example of such a computing system 1000, in accordance with some embodiments. The computing system 1000 may include a computer or computer system 1001A, which may be an individual computer system 1001A or an arrangement of distributed computer systems. The computer system 1001A includes one or more analysis modules 1002 that are configured to perform various tasks according to some embodiments, such as one or more methods disclosed herein. To perform these various tasks, the analysis module 1002 executes independently, or in coordination with, one or more processors 1004, which is (or are) connected to one or more storage media 1006. The processor(s) 1004 is (or are) also connected to a network interface 1007 to allow the computer system 1001A to communicate over a data network 1009 with one or more additional computer systems and/or computing systems, such as 1001B, 1001C, and/or 1001D (note that computer systems 1001B, 1001C and/or 1001D may or may not share the same architecture as computer system 1001A, and may be located in different physical locations, e.g., computer systems 1001A and 1001B may be located in a processing facility, while in communication with one or more computer systems such as 1001C and/or 1001D that are located in one or more data centers, and/or located in varying countries on different continents).

A processor may include a microprocessor, microcontroller, processor module or subsystem, programmable integrated circuit, programmable gate array, or another control or computing device.

The storage media 1006 may be implemented as one or more computer-readable or machine-readable storage media. Note that while in the example embodiment of FIG. 10 storage media 1006 is depicted as within computer system 1001A, in some embodiments, storage media 1006 may be distributed within and/or across multiple internal and/or external enclosures of computing system 1001A and/or additional computing systems. Storage media 1006 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLURAY® disks, or other types of optical storage, or other types of storage devices. Note that the instructions discussed above may be provided on one computer-readable or machine-readable storage medium, or may be provided on multiple computer-readable or machine-readable storage media distributed in a large system having possibly plural nodes. Such computer-readable or machine-readable storage medium or media is (are) considered to be part of an article (or article of manufacture). An article or article of manufacture may refer to any manufactured single component or multiple components. The storage medium or media may be located either in the machine running the machine-readable instructions, or located at a remote site from which machine-readable instructions may be downloaded over a network for execution.

In some embodiments, computing system 1000 contains one or more geological drawing prediction module(s) 1008. In the example of computing system 1000, computer system 1001A includes the geological drawing prediction module 1008. In some embodiments, a single geological drawing prediction module may be used to perform some aspects of one or more embodiments of the methods disclosed herein. In other embodiments, a plurality of geological drawing prediction modules may be used to perform some aspects of methods herein.

It should be appreciated that computing system 1000 is merely one example of a computing system, and that computing system 1000 may have more or fewer components than shown, may combine additional components not depicted in the example embodiment of FIG. 10, and/or computing system 1000 may have a different configuration or arrangement of the components depicted in FIG. 10. The various components shown in FIG. 10 may be implemented in hardware, software, or a combination of both hardware and software, including one or more signal processing and/or application specific integrated circuits.

Further, the steps in the processing methods described herein may be implemented by running one or more functional modules in information processing apparatus such as general-purpose processors or application specific chips, such as ASICs, FPGAs, PLDs, or other appropriate devices. These modules, combinations of these modules, and/or their combination with general hardware are included within the scope of the present disclosure.

Computational interpretations, models, and/or other interpretation aids may be refined in an iterative fashion; this concept is applicable to the methods discussed herein. This may include use of feedback loops executed on an algorithmic basis, such as at a computing device (e.g., computing system 1000, FIG. 10), and/or through manual control by a user who may make determinations regarding whether a given step, action, template, model, or set of curves has become sufficiently accurate for the evaluation of the subsurface three-dimensional geologic formation under consideration.

The foregoing description, for purpose of explanation, has been described with reference to specific embodiments. However, the illustrative discussions above are not intended to be exhaustive or limiting to the precise forms disclosed. Many modifications and variations are possible in view of the above teachings. Moreover, the order in which the elements of the methods described herein are illustrate and described may be re-arranged, and/or two or more elements may occur simultaneously. The embodiments were chosen and described in order to best explain the principles of the disclosure and its practical applications, to thereby enable others skilled in the art to best utilize the disclosed embodiments and various embodiments with various modifications as are suited to the particular use contemplated.

What is claimed is:

1. A method for representing a geology, comprising:
displaying a representation of a known geological feature to a plurality of training users;
receiving training geological feature sketches from the plurality of training users; and
training a machine learning model based at least in part on the training geological feature sketches;
receiving one or more drawing strokes that are part of a geological feature sketch;
predicting, using the machine learning model, one or more predicted geological features based at least in part on the one or more drawing strokes before the geological feature sketch is complete;
displaying the one or more predicted geological features;
receiving a selection of one of the one or more predicted geological features; and
generating an image representing the geology including a digital representation of the selected one of the one or more predicted geological features.

2. The method of claim 1, wherein receiving the one or more drawing strokes comprises receiving metadata representing the one or more drawing strokes, and wherein predicting the one or more predicted geological features is based at least in part on the metadata.

3. The method of claim 2, wherein the metadata comprises an order in which the one or more drawing strokes are received.

4. The method of claim 1, wherein the geological feature sketch at least partially represents a rock layer, wherein the method further comprises determining a depth interval of the rock layer in the image based on a position of the one or more drawing strokes, and wherein generating the image comprises adding the rock layer into the image at a location that represents the depth interval.

5. The method of claim 1, further comprising:
receiving one or more additional drawing strokes after receiving the one or more drawing strokes, the one or more additional drawing strokes being entered also as part of the geological feature sketch; and
updating the one or more predicted geological features based at least in part on the one or more additional drawing strokes in combination with the one or more drawing strokes.

6. The method of claim 1, wherein receiving the training geological feature sketches comprises receiving point location data, timestamp data, data representing an order in which drawing strokes were entered, and pressure data, and wherein training the machine learning model comprises training the machine learning model based at least in part on the point location data, the timestamp data, the data representing an order in which drawing strokes were entered, and the pressure data.

7. A computing system, comprising:
one or more processors; and
a memory system including one or more non-transitory computer-readable media storing instructions that, when executed by at least one of the one or more processors, cause the computing system to perform operations, the operations comprising:
displaying a representation of a known geological feature to a plurality of training users;
receiving training geological feature sketches from the plurality of training users; and
training a machine learning model based at least in part on the training geological feature sketches;
receiving one or more drawing strokes as part of a geological feature sketch;
predicting, using the machine learning model, one or more predicted geological features based at least in part on the one or more drawing strokes before the geological feature sketch is complete;
displaying the one or more predicted geological features;
receiving a selection of one of the one or more predicted geological features; and
generating an image representing the geology including a digital representation of the selected one of the one or more predicted geological features.

8. The computing system of claim 7, wherein receiving the one or more drawing strokes comprises receiving metadata representing the one or more drawing strokes, and wherein predicting the one or more predicted geological features is based at least in part on the metadata.

9. The computing system of claim 8, wherein the metadata comprises an order in which the one or more drawing strokes are received.

10. The computing system of claim 7, wherein the geological feature sketch at least partially represents a rock layer, wherein the computing system further comprises determining a depth interval of the rock layer in the image based on a position of the one or more drawing strokes, and wherein generating the image comprises adding the rock layer into the image at a location that represents the depth interval.

11. The computing system of claim 7, wherein the operations further comprise:
receiving one or more additional drawing strokes after receiving the one or more drawing strokes, the one or more additional drawing strokes being entered also as part of the geological feature sketch; and
updating the one or more predicted geological features based at least in part on the one or more additional drawing strokes in combination with the one or more drawing strokes.

12. The computing system of claim 7, wherein receiving the training geological feature sketches comprises receiving point location data, timestamp data, data representing an order in which drawing strokes were entered, and pressure data, and wherein training the machine learning model comprises training the machine learning model based at least in part on the point location data, the timestamp data, the data representing an order in which drawing strokes were entered, and the pressure data.

13. A non-transitory computer-readable medium storing instructions that, when executed by at least one processor of a computing system, cause the computing system to perform operations, the operations comprising:
displaying a representation of a known geological feature to a plurality of training users;
receiving training geological feature sketches from the plurality of training users; and
training a machine learning model based at least in part on the training geological feature sketches;
receiving one or more drawing strokes as part of a geological feature sketch;
predicting, using the machine learning model, one or more predicted geological features based at least in part on the one or more drawing strokes before the geological feature sketch is complete;
displaying the one or more predicted geological features;
receiving a selection of one of the one or more predicted geological features; and
generating an image representing the geology including a digital representation of the selected one of the one or more predicted geological features.

14. The medium of claim 13, wherein receiving the one or more drawing strokes comprises receiving metadata representing the one or more drawing strokes, and wherein predicting the one or more predicted geological features is based at least in part on the metadata.

15. The medium of claim 14, wherein the metadata comprises an order in which the one or more drawing strokes are received.

16. The medium of claim 13, wherein the geological feature sketch at least partially represents a rock layer, wherein the medium further comprises determining a depth interval of the rock layer in the image based on a position of the one or more drawing strokes, and wherein generating the image comprises adding the rock layer into the image at a location that represents the depth interval.

17. The medium of claim 13, wherein the operations further comprise:
receiving one or more additional drawing strokes after receiving the one or more drawing strokes, the one or more additional drawing strokes being entered also as part of the geological feature sketch; and
updating the one or more predicted geological features based at least in part on the one or more additional drawing strokes in combination with the one or more drawing strokes.

* * * * *